(12) United States Patent
Hashimoto

(10) Patent No.: US 8,471,752 B2
(45) Date of Patent: Jun. 25, 2013

(54) A/D CONVERSION APPARATUS HAVING AN N-STAGE PULSE CIRCULATING CIRCUIT

(75) Inventor: Yukie Hashimoto, Tokyo (JP)

(73) Assignees: Olympus Corporation, Tokyo (JP); Denso Corporation, Kariya-shi, Aichi-ken (JP)

( * ) Notice: Subject to any disclaimer, the term of this patent is extended or adjusted under 35 U.S.C. 154(b) by 42 days.

(21) Appl. No.: 13/288,554

(22) Filed: Nov. 3, 2011

(65) Prior Publication Data

US 2012/0112945 A1 May 10, 2012

(30) Foreign Application Priority Data

Nov. 4, 2010 (JP) ................................. 2010-247672

(51) Int. Cl.
*H03M 1/60* (2006.01)

(52) U.S. Cl.
USPC ........... 341/157; 341/155; 341/163; 341/166; 363/41; 363/71; 363/132; 377/42; 377/124; 345/76; 345/81

(58) Field of Classification Search
USPC ......... 341/130–166; 363/41, 71, 132; 377/42, 377/124; 345/76, 81
See application file for complete search history.

(56) References Cited

U.S. PATENT DOCUMENTS

| | | | | |
|---|---|---|---|---|
| 5,396,247 A | * | 3/1995 | Watanabe et al. | 341/157 |
| 6,466,151 B2 | * | 10/2002 | Nishii et al. | 341/157 |
| 6,940,443 B2 | * | 9/2005 | Terazawa et al. | 341/157 |
| 8,310,390 B2 | * | 11/2012 | Hagihara | 341/166 |
| 2005/0017884 A1 | * | 1/2005 | Tanizawa | 341/118 |
| 2011/0068961 A1 | * | 3/2011 | Hashimoto et al. | 341/155 |
| 2011/0090108 A1 | * | 4/2011 | Hagihara et al. | 341/166 |

FOREIGN PATENT DOCUMENTS

JP 5-259907 A 10/1993

* cited by examiner

*Primary Examiner* — Lam T Mai

(74) *Attorney, Agent, or Firm* — Westerman, Hattori, Daniels & Adrian, LLP

(57) ABSTRACT

An A/D conversion apparatus includes an N-stage pulse circulating circuit including N (N is a natural number, $N \geq 3$) inverting circuits connected in a ring shape, the inverting circuits delaying an input pulse signal by a delay time corresponding to an amplitude of a separately input analog input signal, and outputting inverted pulse signals obtained by inverting the pulse signal, a counter unit that counts a number of circulations by which the pulse signal has circulated in the pulse circulating circuit within a predetermined time based on the inverted pulse signal output from one of the N inverting circuits, and a switching unit that switches an output destination of the inverted pulse signal, which is output from an inverting circuit of an $M^{th}$ (M is an odd natural number, $1 \leq M \leq N-1$) stage of the pulse circulating circuit, according to a change in an operation environment.

5 Claims, 6 Drawing Sheets

A/D CONVERSION APPARATUS HAVING AN N-STAGE PULSE CIRCULATING CIRCUIT

BACKGROUND OF THE INVENTION

1. Field of the Invention

The present invention relates to an A/D conversion apparatus. The present application claims priority of Japanese Priority Patent Application JP 2010-247672 filed in the Japan Patent Office on Nov. 4, 2010, the entire content of which is hereby incorporated by reference.

2. Description of Related Art

A conventional analog/digital (A/D) conversion circuit provided in a consumer device such as a digital camera compares analog signals input from various sensors with a reference voltage of the A/D conversion circuit, thereby converting voltage values of the input analog signals into binary digital data. Moreover, when a change in the voltage values of the analog signals input to the A/D conversion circuit is minute, an analog amplification circuit such as an operational amplifier is used in order to ensure a voltage range necessary for A/D conversion. With such a configuration, the analog signals are amplified using the analog amplification circuit and amplified voltage values are subject to the A/D conversion, so that the binary digital data is obtained.

For example, in JP-A-5-259907, technology in which an A/D conversion circuit is completely realized by a digital circuit is disclosed, for example. In a time A/D conversion circuit disclosed in JP-A-5-259907, a pulse phase difference coding circuit is completely realized by a digital circuit, wherein the pulse phase difference coding circuit includes a pulse circulating circuit, a counter, a latch circuit, a pulse selector, an encoder, and a subtraction circuit.

In the time A/D conversion circuit disclosed in JP-A-5-259907, a pulse circulating circuit includes a plurality of inverting circuits and an analog voltage signal is input as a power supply voltage of the inverting circuits. Furthermore, the number of circulations of a pulse signal circulating in the pulse circulating circuit with a predetermined A/D conversion time is counted, and the position of an edge of the pulse signal is detected, so that digital data converted into binary data can be obtained.

JP-A-5-259907 discloses a technique in which a frequency variable oscillation circuit controls an oscillation frequency to change a predetermined A/D conversion time. For example, when a propagation delay time of the inverting circuit is shortened due to a reduction of an environmental temperature and a value of the digital data is increased, the frequency variable oscillation circuit controls the oscillation frequency to be increased, thereby shortening the A/D conversion time

SUMMARY OF THE INVENTION

According to a first aspect of the present invention, an A/D conversion apparatus includes an N-stage pulse circulating circuit including N (N is a natural number, $N \geq 3$) inverting circuits connected in a ring shape, the inverting circuits delaying an input pulse signal by a delay time corresponding to an amplitude of a separately input analog input signal, and outputting inverted pulse signals obtained by inverting the pulse signal, a counter unit that counts a number of circulations by which the pulse signal has circulated in the pulse circulating circuit within a predetermined time based on the inverted pulse signal output from one of the N inverting circuits, and a switching unit that switches an output destination of the inverted pulse signal, which is output from an inverting circuit of an $M^{th}$ (M is an odd natural number, $1 \leq M \leq N-1$) stage of the pulse circulating circuit, according to a change in the operation environment.

DETAILED DESCRIPTION OF THE INVENTION

First Embodiment

Figure 1:
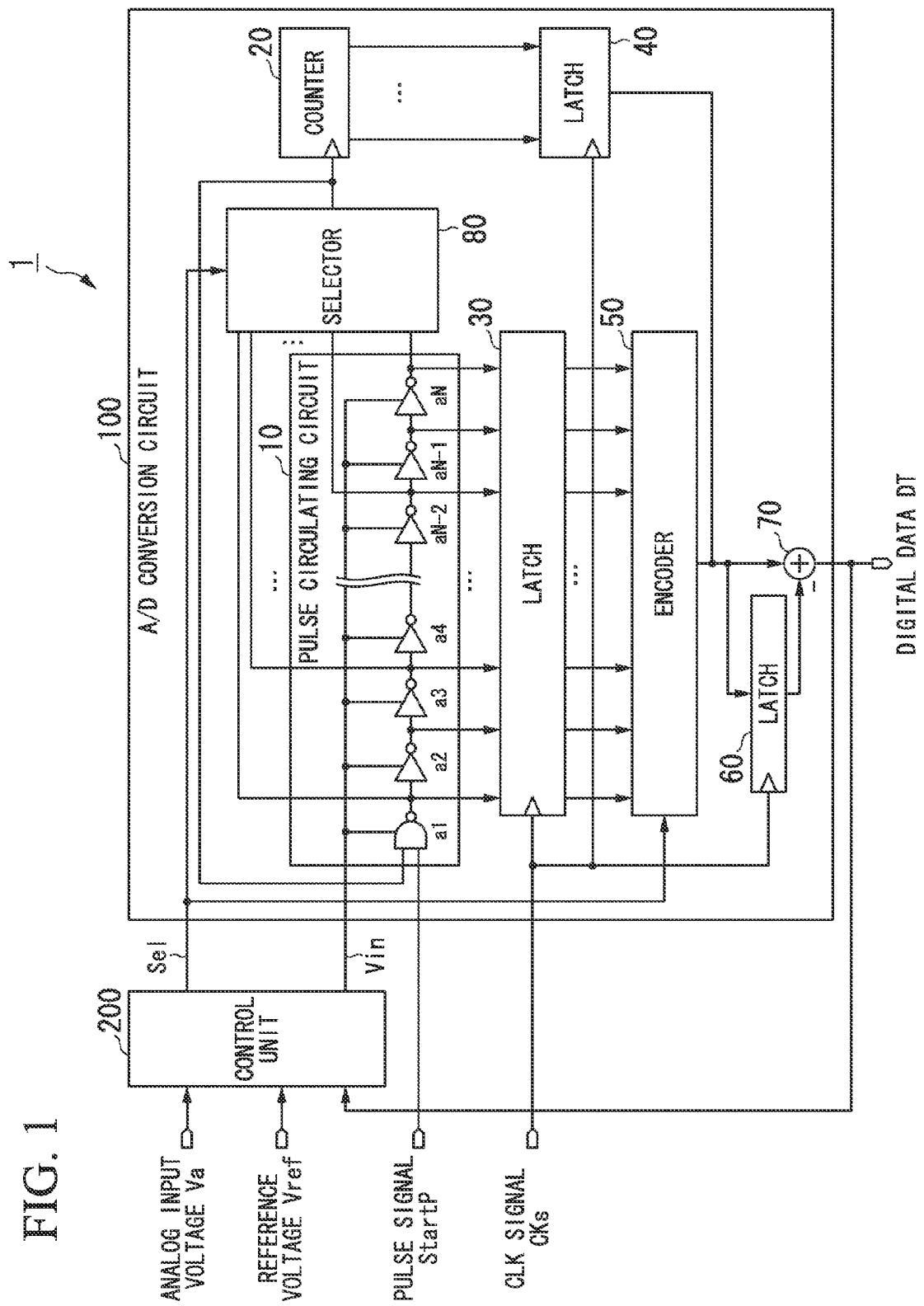
FIG. 1 is a block diagram showing the schematic configuration of an A/D conversion apparatus according to a first embodiment of the present invention.

Hereinafter, embodiments of the present invention will be described with reference to the accompanying drawings. FIG. 1 is a block diagram showing the schematic configuration of an A/D conversion apparatus according to the first embodiment. An A/D conversion apparatus 1 shown in FIG. 1 includes an A/D conversion circuit 100 and a control unit 200. Furthermore, the A/D conversion circuit 100 includes a pulse circulating circuit 10, a counter 20, a latch 30, a latch 40, an encoder 50, a latch 60, a computing unit 70, and a selector 80 (a switching unit).

The A/D conversion apparatus 1 receives a pulse signal StartP for activating A/D conversion, a clock (CLK) signal CKs for determining a constant sampling period (an A/D conversion time) for which A/D conversion is performed, a reference voltage (signal) Vref in the A/D conversion, and an analog input voltage (signal) Va to be subject to the A/D conversion. The A/D conversion apparatus 1 outputs an A/D conversion result as digital data DT.

The control unit 200 selects one voltage (signal) of the analog input voltage Va and the reference voltage Vref, and outputs the selected voltage (signal) to the A/D conversion circuit 100 as an analog input voltage (signal) Vin for which the A/D conversion circuit 100 performs A/D conversion. Furthermore, the control unit 200 outputs a control signal Se1 to the A/D conversion circuit 100 to control the selector 80 and the encoder 50 in the A/D conversion circuit 100. In addition, the control of the control unit 200 for the A/D conversion circuit 100 will be described later.

The A/D conversion circuit 100 activates the A/D conversion according to the pulse signal StartP. The A/D conversion circuit 100 performs the A/D conversion with respect to the analog input voltage Vin, which is input from the control unit 200, with the constant sampling period determined by the CLK signal CKs, and outputs an A/D conversion result as the digital data DT.

The pulse circulating circuit 10 includes one negative AND (NAND) circuit a1, and a plurality (even number) of NOT (INV) circuits a2 to aN as inverting circuits. The pulse circulating circuit 10 is configured as a maximum N (N: an odd natural number)-stage pulse circulating circuit by the NAND circuit a1 and the INV circuits a2 to aN. In the following description, when the functions of the NAND circuit a1 and the INV circuits a2 to aN are not distinguished from each other, they are simply called "inverting circuits." When representing the number of stages of the inverting circuits, reference numerals are added thereto. For example, the NAND circuit a1 is also called an inverting circuit a1 and the INV circuit a3 is also called an inverting circuit a3.

One of output signals of the inverting circuits a1 to aN, which is selected by the selector 80, is input to one input terminal of the NAND circuit a1. Thus, inverting circuits with the preset number of stages are connected in a ring shape in the pulse circulating circuit 10, resulting in the oscillation of the pulse circulating circuit 10. For example, when the inverting circuit a5 is selected by the selector 80, five stages of the inverting circuits a1 to a5 are formed in a ring shape. Furthermore, the pulse signal StartP is input to the other input terminal of the NAND circuit a1. The NAND circuit a1 serves as an inverting circuit for activation, which allows the pulse signal StartP to circulate and the A/D conversion circuit 100 to start A/D conversion.

The output signals of the previous stage NAND circuit a1 and the previous stage INV circuits a2 to aN−1 are input to respective input terminals of the INV circuits a2 to aN. The output signals of the odd-numbered inverting circuits a1 to aN are also output to the selector 80. One of the output signals of the odd-numbered inverting circuits a1 to aN, which is selected by the selector 80, is input to the one input terminal of the NAND circuit a1.

The analog input voltage Vin, which is to be subject to A/D conversion, is applied to the inverting circuits a1 to aN of the pulse circulating circuit 10 as a power supply voltage. The inverting circuits a1 to aN allow input signals to propagate with a propagation delay time corresponding to the voltage value of the analog input voltage Vin, respectively.

Figure 2:
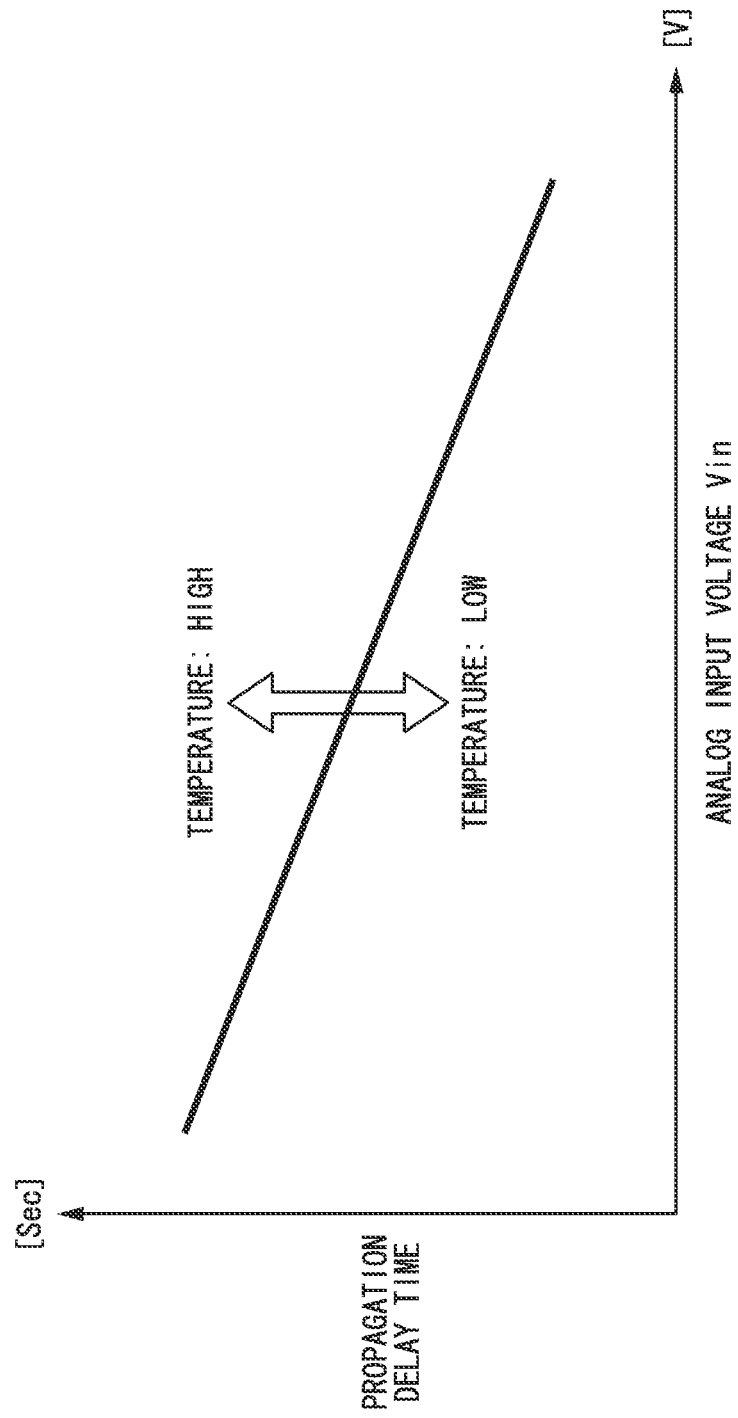
FIG. 2 is a diagram showing the relation between an analog input voltage input to an A/D conversion circuit provided in an A/D conversion apparatus of the first embodiment and a propagation delay time.

Hereinafter, the power supply voltage and the propagation delay time of the inverting circuit of the pulse circulating circuit 10 will be described. FIG. 2 is a diagram showing the relationship between the analog input voltage Vin input to the A/D conversion circuit 100 provided in the A/D conversion apparatus 1 of the first embodiment and the propagation delay time. As shown in FIG. 2, while the propagation delay time of the inverting circuit becomes long when the voltage value of the analog input voltage Vin is low, the propagation delay time of the inverting circuit becomes short when the voltage value of the analog input voltage Vin is high. Thus, the propagation delay time of the inverting circuit corresponds to the voltage value of the analog input voltage Vin. In addition, as shown in FIG. 2, the propagation delay time of the inverting circuit varies depending on a temperature change. That is, the propagation delay time of the inverting circuit becomes long if the temperature is high but becomes short if the temperature is low.

In the pulse circulating circuit 10, since the inverting circuits with the preset number of stages are connected in the ring shape, the input pulse signal StartP circulates in the pulse circulating circuit 10 with the time corresponding to the voltage value of the analog input voltage Vin. The pulse signal StartP circulates in the pulse circulating circuit 10 with the constant sampling period (the A/D conversion time). The number of circulations by which the input pulse signal StartP circulates in the pulse circulating circuit 10, and the position of an inverting circuit through which the input pulse signal StartP has propagated in the pulse circulating circuit 10 are determined by the voltage value of the analog input voltage Vin. In addition, the propagation position of the input pulse signal StartP in the pulse circulating circuit 10 corresponds to the number of stages by which the input pulse signal StartP has moved (passed through) the inverting circuits with the preset number of stages in the pulse circulating circuit 10.

Consequently, in the A/D conversion apparatus 1 according to the first embodiment, it is possible to output the digital data DT according to the voltage value of the analog input voltage Vin based on the number of circulations by which the input pulse signal StartP has circulated in the pulse circulating circuit 10 with the constant sampling period (the A/D conversion time), and the number of stages by which the pulse circulating circuit 10 has passed through the inverting circuits.

The selector 80 receives the output signals of the odd-numbered inverting circuits a1 to aN, and selects any one of the output signals of the odd-numbered inverting circuits a1 to aN in response to the control signal Se1 input from the control unit 200. The selector 80 outputs the selected output signal to both the one input terminal of the NAND circuit a1 of the pulse circulating circuit 10 and the counter 20 as an output signal of a final stage inverting circuit. Consequently, the final stage inverting circuit is switched to one of the odd-numbered inverting circuits a1 to aN, so that it is possible to change the number of stages of the inverting circuits in the pulse circulating circuit 10.

Hereinafter, the number of stages of the inverting circuits in the pulse circulating circuit 10 will be described. The number of stages of the inverting circuits in the pulse circulating circuit 10 can be changed by changing the output signal of the final stage inverting circuit selected by the selector 80. For example, when a pulse circulating circuit is configured with a maximum number of stages using all the inverting circuits provided in the pulse circulating circuit 10, the output signal of the inverting circuit aN (the INV circuit aN) is selected by the selector 80 as the output signal of the final stage inverting circuit. Further, for example, when a pulse circulating circuit is configured with a minimum number of stages using only an initial stage inverting circuit provided in the pulse circulating circuit 10, the output signal of the inverting circuit a1 (the NAND circuit a1) is selected by the selector 80 as the output signal of the final stage inverting circuit. In addition, the inverting circuit that outputs the output signal of the final stage inverting circuit selected by the selector 80 belongs to the odd-numbered inverting circuits a1 to aN because the number of stages of the inverting circuits should be an odd number in order to allow the pulse circulating circuit 10 to oscillate. In this way, the output signal of any (odd-numbered) one of the inverting circuits provided in the pulse circulating circuit 10 is switched by the selector 80, so that the number of stages of the inverting circuits in the pulse circulating circuit 10 can be easily changed.

In the following description, the case in which M (M: an odd natural number, but $3 \leq M \leq N$) is preset as the number of stages of the inverting circuits in the pulse circulating circuit 10 and the output signal of the inverting circuit aM is selected by the selector 80 as the output signal of the final stage inverting circuit will be described as an example. That is, the following description will be given on the assumption that the pulse circulating circuit 10 is configured as an M-stage pulse circulating circuit provided with the inverting circuits a1 to aM.

The counter 20 counts the number of circulations by which the input pulse signal StartP has circulated in the pulse circulating circuit 10 with the preset number of stages based on the output signal of a final stage inverting circuit aM of the pulse circulating circuit 10 selected by the selector 80. Then, the counter 20 outputs the counted number of circulations of the input pulse signal StartP to the latch 40.

The latch 40 holds the number of circulations of the input pulse signal StartP, which is output from the counter 20, at the rising timing of the CLK signal CKs. The number of circulations of the input pulse signal StartP, which is held by the latch 40, is output to the latch 60 and the computing unit 70 as an upper bit of digital data of the constant sampling period determined by the CLK signal CKs.

The latch 30 detects the output terminals of the inverting circuits a1 to aN in the pulse circulating circuit 10, and holds respective output signals of the inverting circuits a1 to aN at the rising timing of the CLK signal CKs. The output signals of the inverting circuits a1 to aN held by the latch 30 are output to the encoder 50 as information indicating the position of the input pulse signal StartP having circulated in the pulse circulating circuit 10.

The encoder 50 selects valid information from the position information of the input pulse signal StartP, which is input from the latch 30, based on the control signal Se1 input from the control unit 200. This is because the output signals of the inverting circuits a1 to aM among the output signals of the inverting circuits a1 to aN held by the latch 30 are the information indicating the position of the input puke signal StartP having circulated in the pulse circulating circuit 10 during the duration of the constant sampling period, but the output signals of the inverting circuits aM to aN are unwanted information in the A/D conversion. The encoder 50 generates digital data based on the selected position information of the input pulse signal StartP. The digital data generated by the encoder 50 is output to the latch 60 and the computing unit 70 as a lower bit of the digital data of the constant sampling period determined by the CLK signal CKs.

In addition, a bit number of the digital data generated by the encoder 50 varies depending on the preset number of stages of the inverting circuits in the pulse circulating circuit 10. For example, it is assumed that the number of stages of the inverting circuits in the pulse circulating circuit 10 is the bit number of the digital data. In this case, when the number of stages of the inverting circuits in the pulse circulating circuit 10 is 15, the encoder 50 generates 15-bit digital data. When the number of stages of the inverting circuits in the pulse circulating circuit 10 is changed to 13, the encoder 50 generates 13-bit digital data. In this way, the encoder 50 generates digital data from only valid information, rather than invalid information, of the position information of the pulse signal StartP input from the latch 30.

The latch 60 holds the upper bit of the digital data input from the latch 40 and the lower bit of the digital data input from the encoder 50, at a timing synchronized with the rising of the CLK signal CKs. In addition, the timing at which the latch 60 holds the digital data input from the latch 40 and the encoder 50 indicates at least a timing delayed by a delay time until the latch 40 and the encoder 50 output the digital data from the rising timing of the CLK signal CKs. The digital data held by the latch 60 is output to the computing unit 70.

The computing unit 70 performs a differential operation with respect to currently A/D converted digital data and previously A/D converted digital data, and outputs an operation result as digital data DT obtained by A/D converting the input analog signal Vin by the A/D conversion circuit 100. The computing unit 70 employs the upper bit of the digital data input from the latch 40 and the lower bit of the digital data input from the encoder 50 as the currently A/D converted digital data. Furthermore, the computing unit 70 employs the digital data input from the latch 60 as the previously A/D converted digital data. Then, the computing unit 70 outputs digital data, which is obtained by subtracting the previously A/D converted digital data from the currently A/D converted digital data, as the digital data DT obtained through the A/D conversion of the A/D conversion circuit 100.

Figure 3:
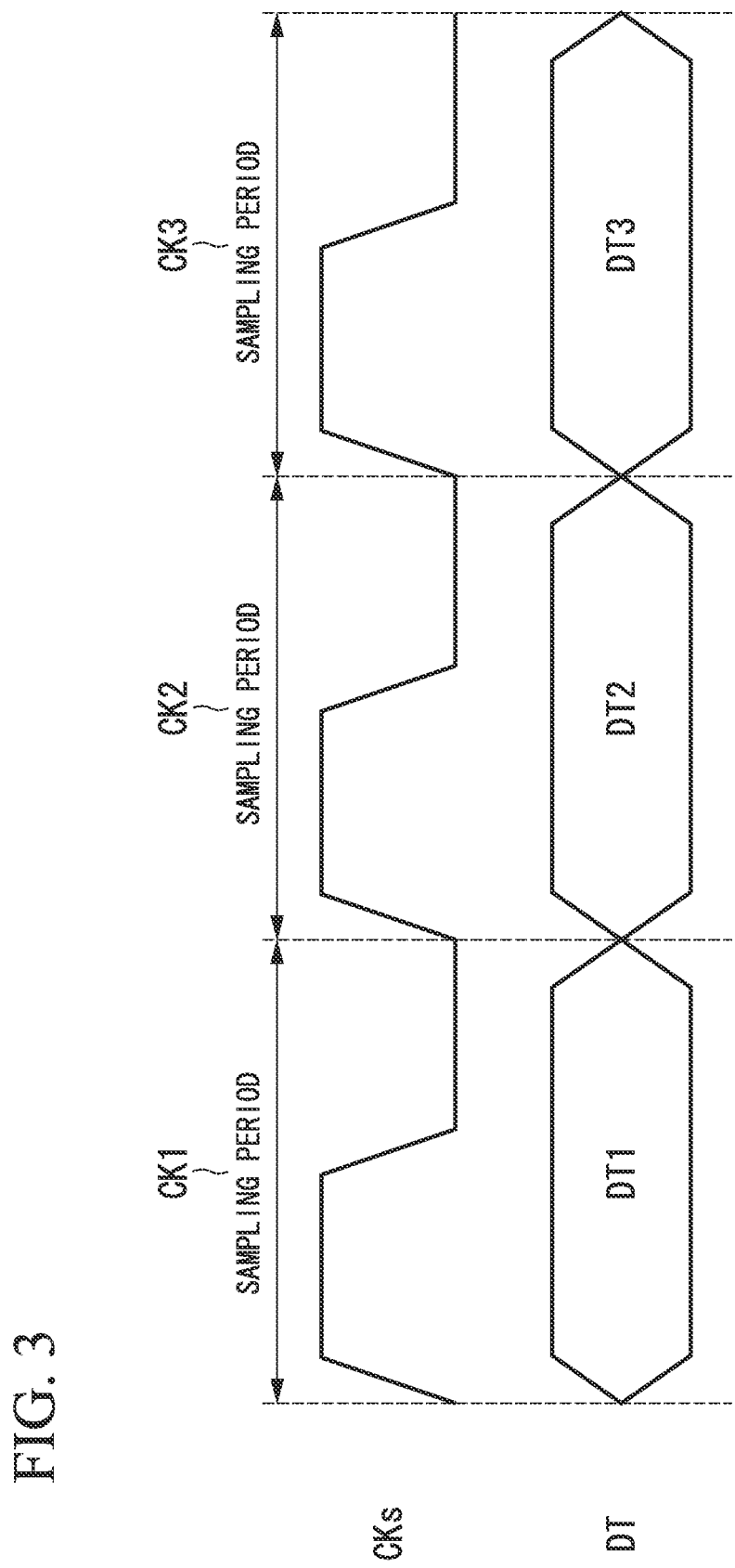
FIG. 3 is a diagram explaining an output timing of digital data output from the A/D conversion apparatus of the first embodiment.

Hereinafter, the timing at which the A/D conversion apparatus 1 of the first embodiment outputs the digital data DT will be described. FIG. 3 is a diagram explaining the output timing of the digital data DT output from the A/D conversion apparatus 1 of the first embodiment. FIG. 3 illustrates the CLK signal CKs, and the digital data DT output with the constant sampling period of the CLK signal CKs. The latch 40 and the latch 30 hold the number of circulations and the position information of the pulse signal StartP, which has circulated in the pulse circulating circuit 10, for each rising timing of the CLK signal CKs indicating the constant sampling period. Furthermore, the latch 60 holds the number of circulations and the position information, which are held by the latch 40 and the latch 30, at the timing synchronized with the rising of the CLK signal CKs. Then, the computing unit 70 performs a differential operation based on the number of circulations and the position information held by the latch 40 and the latch 30, and the number of circulations and the position information held by the latch 60, and outputs the digital data DT, which corresponds to an operation result, for each rising timing of the CLK signal CKs.

In the example of the timing chart illustrated in FIG. 3, the A/D conversion circuit 100 outputs digital data DT1 with a sampling period CK1, outputs digital data DT2 with a sampling period CK2, and outputs digital data DT3 with a sampling period CK3. In this way, the A/D conversion circuit 100 outputs the digital data DT corresponding to the voltage value of the analog input voltage Vin, for each period of the CLK signal CKs.

Next, the control unit 200 provided in the A/D conversion apparatus 1 of the first embodiment will be described.

Figure 4:
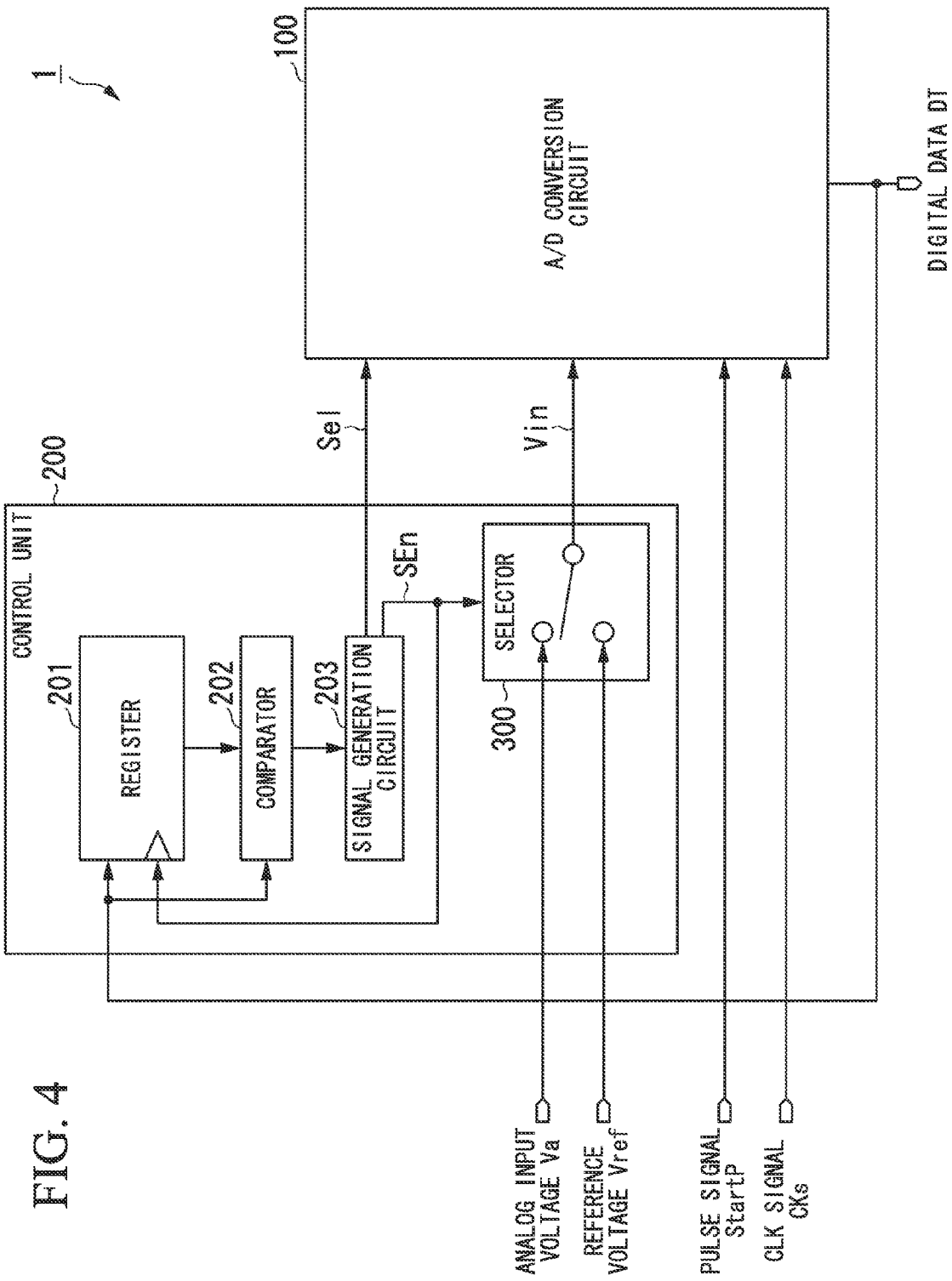
FIG. 4 is a block diagram showing the schematic configuration of a control unit provided in the A/D conversion apparatus of the first embodiment.

FIG. 4 is a block diagram showing the schematic configuration of the control unit 200 provided in the A/D conversion apparatus 1 of the first embodiment. In addition, FIG. 4 also illustrates the A/D conversion circuit 100 connected to the control unit 200. The control unit 200 illustrated in FIG. 4 includes a register 201, a comparator 202, a signal generation circuit 203, and a selector 300.

The register 201 holds the digital data DT as reference digital data, wherein the digital data DT is output when the A/D conversion apparatus 1 of the first embodiment actually performs A/D conversion with respect to a predetermined reference voltage Vref with the constant sampling period determined by the CLK signal CKs. The reference digital data corresponds to a value of the digital data DT output as an actual A/D conversion result of a reference voltage Vref by the A/D conversion apparatus 1, wherein the reference voltage Vref indicates a voltage of a stable voltage signal with a constant voltage value supplied (output) from a stabilized power supply and the like which are rarely affected by a temperature change.

In addition, the voltage value of the reference voltage Vref, for example, indicates a center voltage value of a voltage range of the analog input voltage Va which may be subject to A/D conversion by the A/D conversion circuit 100. For example, when the voltage range of the analog input voltage Va is 0 V to 5.0 V, the voltage value of the reference voltage Vref is 2.5 V. The reference digital data held by the register 201 is output to the comparator 202.

When the reference digital data is held by the register 201, the reference voltage Vref is selected by the selector 300, which will be described later, as the analog input voltage Vin to be subject to A/D conversion, and is input to the A/D conversion circuit 100. In addition, a timing at which the reference voltage Vref is selected by the selector 300 is determined by the signal generation circuit 203 which will be described later.

In addition, when the reference digital data is held by the register 201, the A/D conversion apparatus 1 actually performs the A/D conversion with respect to the reference voltage Vref as described above. Therefore, a time corresponding to several clocks of the CLK signal CKs is required until the digital data DT is output after the A/D conversion apparatus 1 actually performs the A/D conversion. That is, when time loss corresponding to the several clocks occurs, it is preferable to adjust a timing at which the digital data DT is held by the register 201.

As a method of adjusting the timing at which the digital data DT is held by the register 201, for example, a method of separately providing a latch between the output terminal of the digital data DT of the A/D conversion circuit 100 and the input terminal of the register 201, and holding digital data DT held in the separately provided latch by the register 201 is considered.

The comparator 202 compares the reference digital data input from the register 201 with digital data DT (hereinafter referred to as "current digital data") obtained by performing A/D conversion with respect to the reference voltage Vref again. The current digital data indicates the digital data DT output when the reference voltage Vref has actually been subjected to the A/D conversion after the A/D conversion circuit 100 starts to operate and a predetermined time passes. If a temperature change occurs, a difference occurs between the reference digital data which is an A/D conversion result of the same reference voltage Vref and the current digital data. This is caused by a change in an operating environment temperature of the A/D conversion circuit 100. For example, when the operating environment temperature becomes high, since propagation delay times of each inverting circuit in the pulse circulating circuit 10 become long from the relation between an input voltage and a propagation delay time, the current digital data has a smaller value than the reference digital data. The comparator 202 compares the value of the reference digital data with the value of the current digital data to obtain a difference between the two sets of digital data, and outputs a differential value of the digital data to the signal generation circuit 203 as a comparison result.

The signal generation circuit 203 determines the number of stages of the inverting circuits in the pulse circulating circuit 10 based on the differential value of the digital data input from the comparator 202, and generates the control signal Se1 corresponding to the determined number of stages of the inverting circuits. Then, the signal generation circuit 203 outputs the generated control signal Se1 to the A/D conversion circuit 100. In addition, a method by which the signal generation circuit 203 determines the number of stages of the inverting circuits in the pulse circulating circuit 10 will be described later.

In the A/D conversion circuit 100 provided in the A/D conversion apparatus 1 of the first embodiment, two continuous INV circuits (for example, the INV circuit a2 and the INV circuit a3) among the INV circuits a2 to aN of the A/D conversion apparatus 1 are set as an inverting circuit (hereinafter, a minimum unit inverting circuit) of a minimum configuration unit, and the number of stages of inverting circuits is controlled for each minimum unit inverting circuit. In this way, when the number of stages of the inverting circuits has been changed, if the number of stages is controlled for each INV circuit, a logic of the pulse signal StartP input to a next stage INV circuit is prevented from being inverted. Thus, in order to select one minimum unit inverting circuit from (N−1)/2 minimum unit inverting circuits, the signal generation circuit 203, for example, generates a control signal Se1 including (N−1)/2 signal lines indicating whether to select the minimum unit inverting circuit for each minimum unit inverting circuit.

Furthermore, the signal generation circuit 203, for example, may be configured to generate a control signal Se1 of a bit number capable of expressing one minimum unit inverting circuit to (N−1)/2 minimum unit inverting circuits by a numerical value. In this case, for example, a decoder is separately provided either in the A/D conversion circuit 100 or the selector 80 and the encoder 50 to decode the input control signal Se1, thereby determining a selected minimum unit inverting circuit. Then, any one of the minimum unit inverting circuits in the pulse circulating circuit 10 is selected according to a determination result of the decoder.

Furthermore, the signal generation circuit 203 outputs a control signal SEn for selecting the analog input voltage Vin, which is to be subject to A/D conversion, to the selector 300. For example, at an arbitrary timing when the A/D conversion apparatus 1 has been reset, immediately after the A/D conversion circuit 100 starts to operate, or after a constant time passes during the operation of the A/D conversion circuit 100, the signal generation circuit 203 controls the control signal SEn such that the selector 300 selects the reference voltage Vref as the analog input voltage Vin. Furthermore, the signal generation circuit 203, for example, may be configured to output the control signal SEn that causes a control device (not shown) to control the selector 300 to select the reference voltage Vref as the analog input voltage Vin. This configuration, for example, is used to hold the reference digital data in the register 201 at the time of shipment of the A/D conversion apparatus 1.

In addition, when the A/D conversion is performed with respect to analog input voltage Va being subject to A/D conversion in a normal operation of the A/D conversion apparatus 1, the signal generation circuit 203 controls the control signal SEn such that the selector 300 selects the analog input voltage Va as the analog input voltage Vin.

The selector 300 selects any one voltage signal of the reference voltage Vref and the analog input voltage Va in response to the control signal SEn input from the signal generation circuit 203. The voltage signal selected by the selector 300 is output to the A/D conversion circuit 100 as the analog input voltage Vin to be subject to A/D conversion by the A/D conversion circuit 100.

Hereinafter, an example of the method by which the signal generation circuit 203 determines the number of stages of the inverting circuits in the pulse circulating circuit 10 will be described. An increase or decrease in the number of stages of the inverting circuits in the pulse circulating circuit 10 is determined based on the differential value of the digital data which corresponds to the difference between the reference digital data and the current digital data input from the comparator 202. In addition, the number of stages of the inverting circuits is increased or decreased in units of the minimum unit inverting units as described above.

When determining the number of stages of the inverting circuits in the pulse circulating circuit 10, the signal generation circuit 203 first calculates a ratio p by which a value of the digital data DT is changed by an increase or decrease in one minimum unit inverting circuit over the entire range of the value of the digital data DT which may be output by the pulse circulating circuit 10 of the current number of stages. For example, a ratio p, by which the value of the digital data DT is changed by an increase or decrease in one minimum unit inverting circuit over the entire range of the value of the current digital data output by the A/D conversion circuit 100 including the M-stage pulse circulating circuit 10, may be calculated as in Equation 1 below.

$$p = DT_0/((M-1)/2) \quad \text{Equation 1}$$

In Equation 1 above, $DT_0$ denotes the value of the current digital data and M denotes the number of stages of the current inverting circuits in the pulse circulating circuit 10.

Next, when the value of the digital data DT is changed at the calculated ratio p, the signal generation circuit 203 calculates the number m (m: a natural number) of the minimum unit inverting circuits, which is a differential value r nearest the differential value of the digital data input from the comparator 202, as in Equation 2 below.

$$r = m \times p \quad \text{Equation 2}$$

In Equation 2 above, a multiple of the ratio p nearest the differential value of the digital data can be calculated as the number in of the minimum unit inverting circuits.

Then, the signal generation circuit 203 calculates the number L of stages of the inverting circuits in the pulse circulating circuit 10 after changing the stage numbers of the inverting circuits, based on the calculated number m of the minimum unit inverting circuits as in Equation 3 below.

$$L = M \pm 2m \quad \text{Equation 3}$$

In Equation 3 above, 2 m denotes the number of inverting circuits of the minimum unit inverting circuits. In addition, in Equation 3 above, determination regarding whether to increase or decrease the number of stages of inverting circuits with respect to the number M of stages of the current inverting circuits in the pulse circulating circuit 10 is made as follows.

For example, when the differential value of the digital data input from the comparator 202 indicates that the value of the current digital data is larger than the value of the reference digital data, it is necessary to control the number of stages as the value of the current digital data to be decreased and to reduce the difference between the value of the current digital data and the value of the reference digital data. To this end, the signal generation circuit 203 determines the number L of stages of the inverting circuits according to Equation 3 above such that the number of stages of the inverting circuits is increased with respect to the number M of stages of the current inverting circuits: The number of stages of the inverting circuits in the pulse circulating circuit 10 is increased, so that the number of circulations by which the pulse signal StartP circulates in the pulse circulating circuit 10 with the constant sampling period, that is, the number of circulations counted by the counter 20, is reduced, resulting in a reduction of the value of the digital data DT.

Further, for example, when the differential value of the digital data input from the comparator 202 indicates that the value of the current digital data is smaller than the value of the reference digital data, it is necessary to control the number of stages as the value of the current digital data to be increased and to reduce the difference between the value of the current digital data and the value of the reference digital data. To this end, the signal generation circuit 203 determines the number L of stages of the inverting circuits according to Equation 3 above such that the number of stages of the inverting circuits is decreased with respect to the number M of stages of the current inverting circuits. The number of stages of the inverting circuits in the pulse circulating circuit 10 is decreased, so that the number of circulations by which the pulse signal StartP circulates in the pulse circulating circuit 10 with the constant sampling period is increased, resulting in an increase in the value of the digital data DT.

The signal generation circuit 203 generates the control signal Se1 based on the changed number L of stages of the inverting circuits in the pulse circulating circuit 10. Then, the signal generation circuit 203 outputs the generated control signal Se1 to the A/D conversion circuit 100 at a timing before the A/D conversion circuit 100 starts A/D conversion.

As described above, in the A/D conversion apparatus 1 of the first embodiment, the reference digital data can be compared with the current digital data at an arbitrary timing, and the number of stages of the inverting circuits in the pulse circulating circuit 10 can be changed based on the difference between the reference digital data and the current digital data. Consequently, the A/D conversion circuit 100 can perform A/D conversion using the pulse circulating circuit 10 of the changed number of stages. Then, the A/D conversion circuit 100 can output digital data DT with a small difference between the value of the current digital data and the value of the reference digital data, which are obtained by A/D converting the reference voltage Vref. Consequently, in a subsequent operation of the A/D conversion circuit 100, when the analog input voltage Va is subject to A/D conversion, it is possible to output digital data DT that is less affected by a temperature change.

Furthermore, in the A/D conversion apparatus 1 of the first embodiment, the number of stages of the inverting circuits in the pulse circulating circuit 10 is changed, so that the digital data DT is less affected by a temperature change. Thus, as compared with the conventional art in which the influence of a temperature change is reduced by controlling an oscillation frequency, power consumption of a circuit is not increased.

In addition, the accuracy of the digital data DT is high when the number of stages of the inverting circuits in the pulse circulating circuit 10 is large. That is, when the value of the number M of stages of the current inverting circuits is larger in Equation 1 above, the accuracy is higher.

Furthermore, the value of the number M of stages as an initial value of the inverting circuits in the pulse circulating circuit 10 is set to be the center position of the maximum number M of stages of the inverting circuits provided in the pulse circulating circuit 10, that is, the value of the number M of stages is set to (N+1)/2, so that it is possible to maximize the number of stages at which the number of stages of the inverting circuits can be increased or decreased.

Second Embodiment

Figure 5:
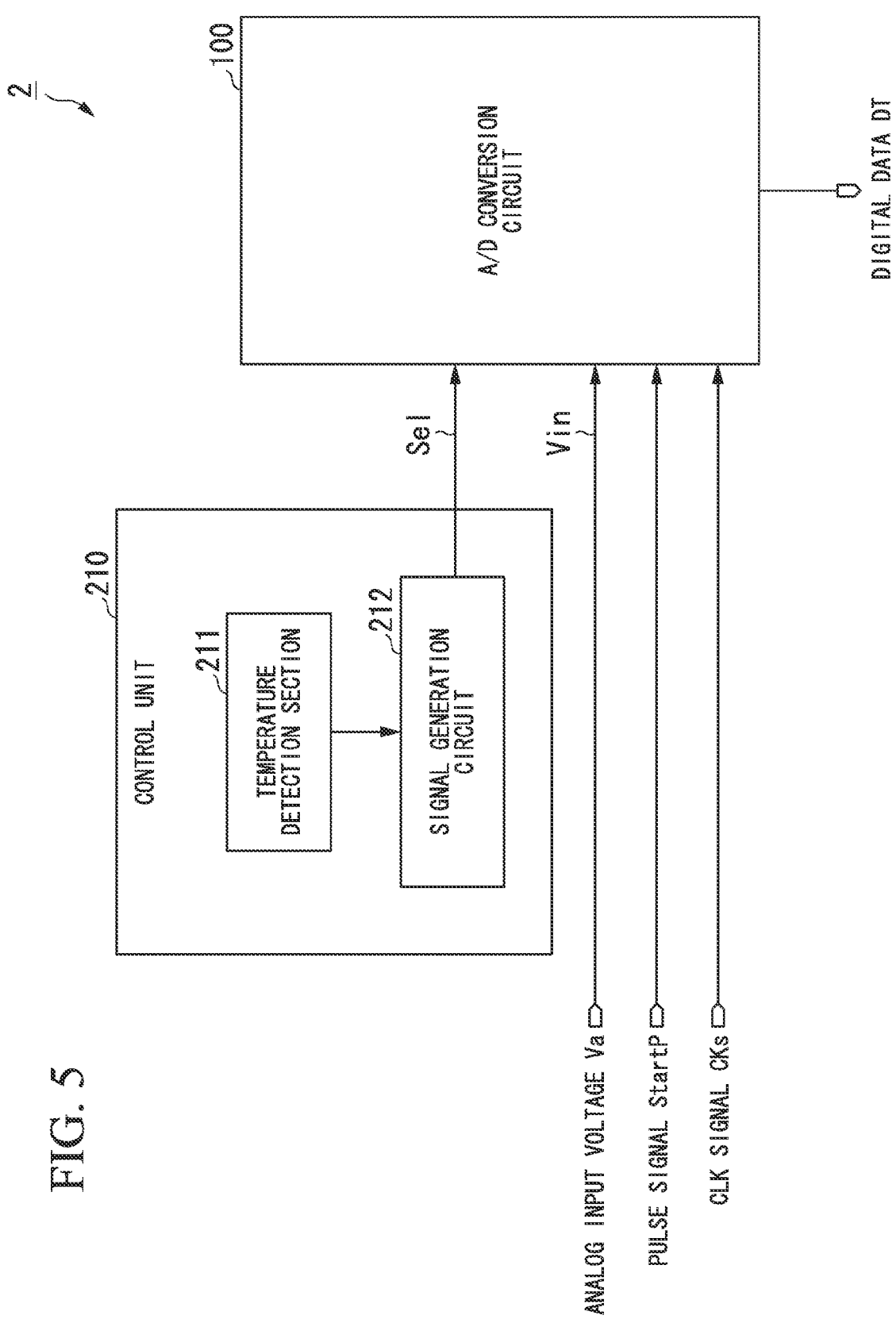
FIG. 5 is a block diagram showing the schematic configuration of an A/D conversion apparatus according to a second embodiment of the present invention.

Hereinafter, the second embodiment of the present invention will be described. FIG. 5 is a block diagram showing the schematic configuration of an A/D conversion apparatus according to the second embodiment of the present invention. An A/D conversion apparatus 2 illustrated in FIG. 5 includes the A/D conversion circuit 100 and a control unit 210. Furthermore, the control unit 210 includes a temperature detection section 211 and a signal generation circuit 212. In addition, since the A/D conversion circuit 100 of the A/D conversion apparatus 2 illustrated in FIG. 5 is the same as the A/D conversion circuit 100 illustrated in FIG. 1, detailed description thereof will be omitted. In the following description, only elements different from those of the A/D conversion apparatus 1 illustrated in FIG. 1 will be described.

The control unit 210 outputs a control signal Se1 to the A/D conversion circuit 100 to control the selector 80 and the encoder 50 in the A/D conversion circuit 100.

The temperature detection section 211, for example, includes a detector such as a temperature sensor for detecting an operating environment temperature of the A/D conversion circuit 100, and outputs information on the detected operating environment temperature (hereinafter referred to as "environment temperature information") to the signal generation circuit 212.

The signal generation circuit 212 generates the control signal Se1, which controls the number of stages of the inverting circuits in the pulse circulating circuit 10, based on the environment temperature information input from the temperature detection section 211. The signal generation circuit 212 outputs the generated control signal Se1 to the A/D conversion circuit 100. A method by which the signal generation circuit 212 generates the control signal Se1 is, for example, as follows.

A first method of generating the control signal Se1 is a method in which the signal generation circuit 212, for example, stores table information in which the number of stages of the inverting circuits in the pulse circulating circuit 10 corresponding to the operating environment temperature is recorded. The signal generation circuit 212 selects the number of stages of corresponding inverting circuits from the table information based on the environment temperature information input from the temperature detection section 211, and generates the control signal Se1 corresponding to the selected number of stages of the inverting circuits.

Furthermore, a second method of generating the control signal Se1 is, for example, a method in which a difference between a current operating environment temperature and a reference operating environment temperature is calculated based on the environment temperature information input from the temperature detection section 211, and a differential value of digital data is calculated from the calculated temperature difference. For example, a differential value between digital data DT corresponding to the current digital data in the first embodiment which is output at the current operating environment temperature, and digital data DT corresponding to the reference digital data in the first embodiment which is output at the reference operating environment temperature is calculated from the calculated temperature difference according to a predetermined operation Equation. Then, the number of stages of the inverting circuits in the pulse circulating circuit 10 is determined using Equations 1 to 3 described in the first embodiment, and the control signal Se1 corresponding to the determined number of stages of the inverting circuits is generated.

As described above, in the A/D conversion apparatus 2 of the second embodiment, it is possible to change the number of stages of the inverting circuits in the pulse circulating circuit 10 based on the environment temperature information detected by the temperature detection section 211. Consequently, similarly to the A/D conversion apparatus 1 of the first embodiment, it is possible to output the digital data DT less affected by a temperature change.

Third Embodiment

Figure 6:
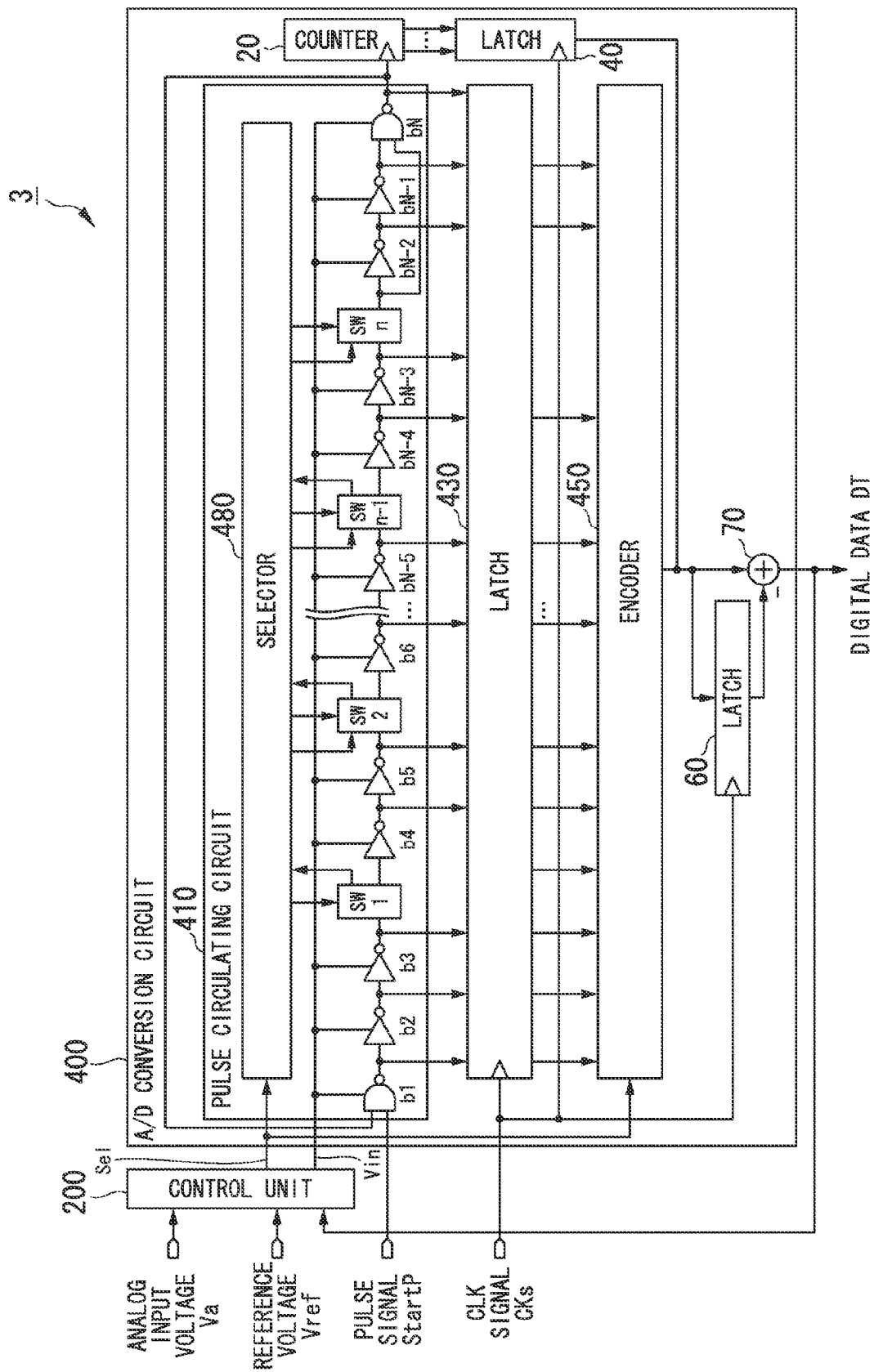
FIG. 6 is a block diagram showing the schematic configuration of an A/D conversion apparatus according to a third embodiment of the present invention.

Hereinafter, the third embodiment of the present invention will be described. FIG. 6 is a block diagram showing the schematic configuration of an A/D conversion apparatus according to the third embodiment of the present invention. An A/D conversion apparatus 3 illustrated in FIG. 6 includes an A/D conversion circuit 400 and the control unit 200. Furthermore, the A/D conversion circuit 400 includes a pulse circulating circuit 410, a counter 20, a latch 430, a latch 40, an encoder 450, a latch 60, and a computing unit 70. In addition, the same reference numerals are used to designate elements of the A/D conversion circuit 400, which are the same as those elements of the A/D conversion circuit 100 illustrated in FIG. 1, and detailed description thereof will be omitted. Thus, in the following description, only elements different from those of the A/D conversion apparatus 1 illustrated in FIG. 1 will be described.

The control unit 200 of the A/D conversion apparatus 3 illustrated in FIG. 6 is the same as the control units 200 of the A/D conversion apparatuses 1 illustrated in FIGS. 1 and 4. However, the control unit 200 of the A/D conversion apparatus 3 outputs a control signal Se1 corresponding to the configuration of the A/D conversion circuit 400. Furthermore, the control unit 200 of the A/D conversion apparatus 3 can also be replaced with the control unit 210 of the A/D conversion apparatus 2 illustrated in FIG. 5. In addition, since the operation of the control unit 200 in the A/D conversion apparatus 3 is the same as that of the control unit 200 of the A/D conversion apparatus 1 or the control unit 210 of the A/D conversion apparatus 2, detailed description thereof will be omitted.

Similarly to the A/D conversion circuit 100 of the A/D conversion apparatus 1 illustrated in FIG. 1, the A/D conversion circuit 400 outputs digital data DT, which is obtained by A/D converting the analog input voltage Vin input from the control unit 200, according to the pulse signal StartP. However, the A/D conversion circuit 400 changes the number of stages of the inverting circuits in the pulse circulating circuit using a method different from that of the A/D conversion circuit 100.

The pulse circulating circuit 410 includes an initial stage NAND circuit b1, a plurality (even number) of INV circuits b2 to bN−1, a final stage NAND circuit bN, switches SW1 to SWn (n: a natural number, but $1 \leq n \leq (N/2)-2$), and a selector 480 (a switching unit). The pulse circulating circuit 410 can be configured as a maximum N-stage (N: an even natural number) pulse circulating circuit by the NAND circuit b1, the INV circuits b2 to bN−1, and the NAND circuit bN. In the following description, when the functions of the NAND circuit b1 and the NAND circuit bN are not distinguished from those of the INV circuits b2 to bN−1, they are simply called "inverting circuits." When representing the number of stages of the inverting circuits, reference numerals are added thereto. For example, the final stage NAND circuit bN is also called an inverting circuit bN and the INV circuit b3 is also called an inverting circuit b3.

The output signal of the final stage NAND circuit bN is input to one input terminal of the initial stage NAND circuit b1. In this way, inverting circuits with the preset number of stages are connected in a ring shape in the pulse circulating circuit 410. Furthermore, the pulse signal StartP is input to the other input terminal of the NAND circuit b1. The NAND circuit b1 serves as an inverting circuit for activation, which allows the pulse signal StartP to circulate and the A/D conversion circuit 100 to start A/D conversion.

The output signal of the previous stage INV circuit bN−1 is input to one input terminal of the final stage NAND circuit bN. Furthermore, any one of the output signals of the INV circuits b3 to bN−3 before two stages, which are output from the switch SWn, is input to the other input terminal of the NAND circuit bN. Thus, the pulse circulating circuit 410 is configured to oscillate. Furthermore, the output signal of the final stage NAND circuit bN is input to the one input terminal of the initial stage NAND circuit b1 and is output to the counter 20. Thus, it is possible for the counter 20 to count the number of circulations by which the pulse signal StartP has circulated in the pulse circulating circuit 410 of the preset number of stages.

The output signals of the previous stage NAND circuit b1 or the previous stage INV circuits b2 to bN−2 are input to the input terminals of the INV circuits b2 to bN−1 through the switches SW1 to SWn, or are directly input to the input terminals of the INV circuits b2 to bN−1, respectively. In further detail, the output signals of the previous stage NAND circuit b1 or the previous stage INV circuits b3, b5, . . . , bN−5 and bN−3 are input to the input terminals of the even-numbered INV circuits b2, b4, b6, . . . , bN−4 and bN−2 in the pulse circulating circuit 410 through the switches SW1 to SWn, respectively. Furthermore, the output signals of the previous stage INV circuits b2, b4, . . . , bN−6, bN−4 and bN−2 are directly input to the input terminals of the odd-numbered INV circuits b3, b5, . . . bN−5, bN−3 and bN−1 in the pulse circulating circuit 410, respectively. Furthermore, the output signals of the odd-numbered INV circuits b3, b5, . . . , bN−5 and bN−3 in the pulse circulating circuit 410 are output to the switches SW1 to SWn, respectively.

The analog input voltage Vin to be subject to A/D conversion is applied to the inverting circuits b1 to bN of the pulse circulating circuit 410 as a power supply voltage. Each of the inverting circuits b1 to bN allows the input signal to propagate with a propagation delay time corresponding to the voltage value of the analog input voltage Vin.

The selector 480 outputs control signals (hereinafter referred to as "switching signals") for changing the number of stages of the inverting circuits in the pulse circulating circuit 410 to the switches SW1 to SWn in response to the control signal Se1 input from the control unit 200.

The switches SW1 to SWn select output signals of previous stage inverting circuits, which are input to next stage inverting circuits, in response to the switching signals input from the selector 480, respectively.

Hereinafter, a method of changing the number of stages of the inverting circuits in the pulse circulating circuit 410 will be described.

The number of stages of the inverting circuits in the pulse circulating circuit 410 can be changed when the switches SW1 to SWn select output signals, which are output to next stage inverting circuits connected to the switches SW1 to SWn, in response to the switching signals input from the selector 480, respectively. As illustrated in FIG. 6, the selector 480 receives the output signals from the odd-numbered INV circuits b3, b5, . . . , bN−5 and bN−3, except for the inverting circuit b1, through the switches SW1 to SWn, respectively. The selector 480 selects one of the output signals input from the inverting circuits in response to the control signal Se1 input from the control unit 200, and inputs the selected output signal to the even-numbered INV circuits b4, b6, . . . , bN−4 and bN−2, except for the inverting circuit b2, through the switches SW1 to SWn, respectively.

For example, when a pulse circulating circuit with a maximum number of stages is configured using all the inverting circuits provided in the pulse circulating circuit 410, the selector 480 outputs switching signals such that the switches SW1 to SWn input the output signals of the INV circuits b3, b5, . . . , bN−5 and bN−3 to the INV circuits b4, b6, . . . , bN−4 and bN−2, respectively. Furthermore, for example, when a pulse circulating circuit with a minimum number of stages is configured using only the inverting circuits b1 to b3 and the inverting circuits bN−2 to bN provided in the pulse circulating circuit 410, the selector 480 outputs a switching signal such that the output signal of the inverting circuit b3, which is input through the switch SW1, is input to the inverting circuit bN−2 through the switch SWn.

Furthermore, for example, it is possible to configure a pulse circulating circuit using only the inverting circuits b1 to b3, the inverting circuits b6 to bN−5, and the inverting circuits bN−2 to bN provided in the pulse circulating circuit 410. In this case, the selector 480 outputs switching signals such that the output signal of the inverting circuit b3 input through the switch SW1 is input to the inverting circuit b6 through the switch SW2, and the output signal of the inverting circuit bN−5 input through the switch SWn−1 is input to the inverting circuit bN−2 through the switch SWn.

In addition, even when the pulse circulating circuit 410 of the same number of stages is configured, various methods may be used to configure the number of stages of the inverting circuits in the pulse circulating circuit 410. For example, even when the 12-stage pulse circulating circuit 410 illustrated in FIG. 6 is changed to a 10-stage pulse circulating circuit 410, the following methods may be used. According to a first method of realizing the 10-stage pulse circulating circuit 410, the inverting circuits b1 to b3 and the inverting circuits b6 to bN provided in the pulse circulating circuit 410 are used. In this case, the selector 480 outputs a switching signal such that the output signal of the inverting circuit b3 input through the switch SW1 is input to the inverting circuit b6 through the switch SW2. Furthermore, a second method of realizing the 10-stage pulse circulating circuit 410 is a method in which the inverting circuits b1 to bN−5 and the inverting circuits bN−2 to bN provided in the pulse circulating circuit 410 are used. In this case, the selector 480 outputs a switching signal such that the output signal of the inverting circuit bN−5 input through the switch SWn−1 is input to the inverting circuit bN−2 through the switch SWn.

Consequently, the selector 480 controls the switches SW1 to SWn in response to the control signal Se1 input from the control unit 200, thereby freely changing the number of stages of the inverting circuits in the pulse circulating circuit 410. In addition, as illustrated in FIG. 6, the switch SW1 only output the output signal of the inverting circuit b3, which is connected to the switch SW1, to the inverting circuit b4 and the selector 480 without selecting an output signal of a previous stage inverting circuit to be output to the inverting circuit b4. Furthermore, the switch SWn does not output the output signal of the inverting circuit bN−3, which is connected to the switch SWn, to the selector 480.

In addition, an output signal selected from the output signals of odd-numbered inverting circuits in the pulse circulating circuit 410 is selected as the output signal of a next stage inverting circuit because the number of stages of inverting circuits needs to be an even number in order to allow the pulse circulating circuit 410 to oscillate. That is, in the pulse circulating circuit 410, the pulse circulating circuit 410 is configured to oscillate by the 3-stage inverting circuits bN−2 to bN, and the number of stages of inverting circuits are controlled for each minimum unit inverting circuit including two INV circuits. Thus, since an odd number of remaining inverting circuits, other than the 3-stage inverting circuits bN−2 to bN, are controlled for each minimum unit inverting circuit (an even number), odd-numbered inverting circuits are controlled.

In addition, the selector 480 controls the previous stage switches SW1 to SWn−1 such that a "High" level or a "Low" level signal is input to inverting circuits not used by the control of the switches SW1 to SWn. This prevents the output signals of the unused inverting circuits from having a inconstant value. For example, in an example of configuring a pulse circulating circuit using only the inverting circuits b1 to b3, the inverting circuits b6 to bN−5, and the inverting circuits bN−2 to bN provided in the pulse circulating circuit 410, unused inverting circuits are the inverting circuits b4, b5, bN−4 and bN−3. In this case, the selector 480 controls the switch SW1 to input a "High" level signal to the input terminal of the inverting circuit b4 and the switch SWn−1 to input a "Low" level signal to the input terminal of the inverting circuit bN−4.

The latch 430 detects the output terminals of the inverting circuits b1 to bN of the pulse circulating circuit 410, and holds the output signals of the inverting circuits b1 to bN at the rising timing of the CLK signal CKs. The output signals of the inverting circuits b1 to bN held by the latch 430 are output to the encoder 450 as information indicating the position of the pulse signal StartP having circulated in the pulse circulating circuit 410.

The encoder 450 selects valid information from the position information of the pulse signal StartP, which is input from the latch 430, based on the control signal Se1 input from the control unit 200, and generates digital data.

The latch 60 holds an upper bit of the digital data, which is input from the latch 40, and a lower bit of the digital data, which is input from the encoder 450, at a timing synchronized with the rising of the CLK signal CKs.

The computing unit 70 employs the upper bit of the digital data, which is input from the latch 40, and the lower bit of the digital data, which is input from the encoder 450, as currently A/D converted digital data. The computing unit 70 outputs a result, which is obtained by performing a differential operation with respect to the currently A/D converted digital data and previously A/D converted digital data, as digital data DT obtained through the A/D conversion of the input analog signal Vin by the A/D conversion circuit 400.

As described above, in the A/D conversion apparatus 3 of the third embodiment, it is possible to freely change the number of stages of the inverting circuits in the pulse circulating circuit 410 according to the use situation of the A/D conversion circuit 400. Consequently, similarly to the A/D conversion apparatus 1 of the first embodiment and the A/D conversion apparatus 2 of the second embodiment, it is possible to output digital data DT that is less affected by a temperature change.

In addition, even in the A/D conversion circuit 400, similarly to the A/D conversion circuit 100, the accuracy of the digital data DT is higher when the number of stages of the inverting circuits in the pulse circulating circuit 410 is larger. Furthermore, the number of stages as an initial value of the inverting circuits in the pulse circulating circuit 410 is set to be the center position of the maximum number N of stages of the inverting circuits provided in the pulse circulating circuit 410, so that it is possible to maximize the number of stages at which the stage numbers of the inverting circuits can be increased or decreased.

As described above, according to the embodiments of the present invention, it is possible to freely change the number of stages of the inverting circuits in the pulse circulating circuit provided in the A/D conversion circuit at an arbitrary timing according to the use situation of the A/D conversion apparatus. Consequently, it is possible to change the number of stages of the inverting circuits in the pulse circulating circuit in correspondence with a temperature change in the use environment of the A/D conversion apparatus, resulting in the achievement of stable digital data that is hardly affected by the temperature change.

Furthermore, in the embodiments of the present invention, since it is possible to cope with a temperature change not by controlling an oscillation frequency as with the conventional A/D conversion circuit but by changing the number of stages of the inverting circuits in the pulse circulating circuit, even when the temperature change occurs, it is possible to perform A/D conversion with a constant sampling period (an A/D conversion time). Consequently, even when a change occurs in the temperature of the use environment of the A/D conversion apparatus, it is possible to output accurate digital data by reducing the influence of the temperature change without an increase in power consumption as with the conventional A/D conversion circuit.

Furthermore, according to the embodiments of the present invention, it is possible to freely change the number of stages of the inverting circuits in the pulse circulating circuit to an arbitrary number of stages. Consequently, even when there is a factor other than a temperature change, it is possible to improve the degree of freedom of the use environment of the A/D conversion apparatus by changing the number of stages of the inverting circuits in the pulse circulating circuit. That is, in the present embodiments, the case in which the number of stages of the inverting circuits in the pulse circulating circuit is changed according to a temperature change in the use environment of the A/D conversion apparatus has been described. However, a factor causing a change in the number of stages of the inverting circuits in the pulse circulating circuit is not limited to the embodiments of the present invention. For example, when a voltage range of an analog input voltage, which can be subject to A/D conversion by the A/D conversion circuit, is narrow (when a maximum value of the analog input voltage is small), it is also possible to reduce the number of stages of the inverting circuits in the pulse circulating circuit for the purpose of increasing a value of digital data to be output. This is an example corresponding to a factor of the voltage range of the analog input voltage.

In addition, in the embodiments, the case in which the control unit is provided inside the A/D conversion apparatus has been described. However, the arrangement of the control unit is not limited to the embodiments of the present invention. For example, the control unit may be provided outside the A/D conversion apparatus.

Furthermore, in the first embodiment and the second embodiment, the case in which the number of stages of the inverting circuits in the pulse circulating circuit provided in the A/D conversion circuit is an odd number has been described. In the third embodiment, the case in which the number of stages of the inverting circuits in the pulse circulating circuit provided in the A/D conversion circuit is an even number has been described. However, the number of stages of the inverting circuits in the pulse circulating circuit is not limited to the embodiments of the present invention. That is, whether the number of stages of the inverting circuits in the pulse circulating circuit is an even number or an odd number, it is possible to cope with the respective cases through consideration in the same manner as the embodiments of the present invention.

So far, the embodiments of the present invention have been described with reference to the accompany drawings. However, detailed configurations are not limited thereto. The present invention may be subject to addition, omission, replacement, and other modifications of the configuration in a range not departing from the spirit or scope of the present invention. The present invention is not limited by the above description, but it is limited by the scope of claims attached herewith.

What is claimed is:

1. An A/D conversion apparatus comprising:
   an N-stage pulse circulating circuit comprising N (N is a natural number, N≧3) inverting circuits connected in a ring shape, the inverting circuits delaying an input pulse signal by a delay time corresponding to an amplitude of a separately input analog input signal, and outputting inverted pulse signals obtained by inverting the pulse signal;

a counter unit that counts a number of circulations by which the pulse signal has circulated in the pulse circulating circuit within a predetermined time based on the inverted pulse signal output from one of the N inverting circuits; and a switching unit that switches an output destination of the inverted pulse signal, which is output from an inverting circuit of an $M^{th}$ (M is an odd natural number, $1 \leq M \leq N-1$) stage of the pulse circulating circuit, according to a change in an operation environment.

2. The A/D conversion apparatus according to claim 1, further comprising:

a control unit that selects the inverting circuit of the $M^{th}$ stage for outputting the inverted pulse signal to be input to an inverting circuit of a $1^{st}$ stage according to the change in the operation environment, and outputs a control signal including information of the selected inverting circuit, wherein the switching unit switches the output destination of the inverted pulse signal, which is output from the selected inverting circuit of the $M^{th}$ stage, from an inverting circuit of an $(M+1)^{th}$ stage to the inverting circuit of the $1^{st}$ stage and the counter unit based on the control signal output from the control unit.

3. The A/D conversion apparatus according to claim 2, wherein the control unit selects the inverting circuit of the $M^{th}$ stage after the change in the operation environment occurs.

4. The A/D conversion apparatus according to claim 3, further comprising:

a detection unit that detects a change in an operation environment temperature of the A/D conversion apparatus, or a change in a reference voltage of the A/D conversion apparatus, wherein the control unit selects the inverting circuit of the $M^{th}$ stage based on a detection result of the detection unit.

5. The A/D conversion apparatus according to claim 1, further comprising:

a control unit that selects the inverting circuit of the $M^{th}$ stage for outputting the inverted pulse signal to be input to an inverting circuit of an $L^{th}$ (L is an even natural number, $1 \leq M \leq N-1$) stage according to the change in the operation environment, and outputs a control signal including information of the selected inverting circuit, wherein the pulse circulating circuit further comprises:

a switch that switches the output destination of the inverted pulse signal output from the inverting circuit of the $M^{th}$ stage, and an input source of the inverted pulse signal to be input to an inverting circuit of an $(M+1)^{th}$ stage between the inverting circuit of the $M^{th}$ stage and the inverting circuit of the $(M+1)^{th}$ stage, and the switching unit switches the output destination of the inverted pulse signal, which is output from the selected inverting circuit of the $M^{th}$ stage, from the inverting circuit of the $(M+1)^{th}$ stage to the inverting circuit of the $L^{th}$ stage through the switch based on the control signal output from the control unit.

* * * * *